(12) United States Patent
Yasuda et al.

(10) Patent No.: US 7,375,589 B2
(45) Date of Patent: May 20, 2008

(54) POWER AMPLIFIER SYSTEM PROVIDED WITH IMPROVED PROTECTION FUNCTION

(75) Inventors: Katsuhiro Yasuda, Yokohama (JP); Hiroyuki Tsurumi, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 51 days.

(21) Appl. No.: 11/534,021

(22) Filed: Sep. 21, 2006

(65) Prior Publication Data

US 2007/0075781 A1    Apr. 5, 2007

(30) Foreign Application Priority Data

Sep. 22, 2005  (JP) ............................. 2005-275997

(51) Int. Cl.
*H03F 3/04* (2006.01)

(52) U.S. Cl. .................. 330/298; 330/296; 330/207 P; 330/51

(58) Field of Classification Search ................ 330/296, 330/298, 207 P, 51
See application file for complete search history.

(56) References Cited

U.S. PATENT DOCUMENTS 4,402,029 A * 8/1983 Fujita ........................ 361/90
5,543,760 A * 8/1996 Honda et al. ............... 330/298
5,847,610 A * 12/1998 Fujita ........................ 330/298
6,097,254 A   8/2000 Yamamoto
6,469,575 B1 10/2002 Oki et al.
2005/0231287 A1 10/2005 Wong et al.

FOREIGN PATENT DOCUMENTS

JP    2001-7659    1/2001
JP    2004-112019  4/2004

* cited by examiner

*Primary Examiner*—Robert Pascal
*Assistant Examiner*—Hieu Nguyen
(74) *Attorney, Agent, or Firm*—Oblon, Spivak, McClelland, Maier & Neustadt, P.C.

(57) ABSTRACT

The present invention provides a power amplifier system that includes a power terminal, a ground terminal, an output terminal, a ripple terminal, a control terminal, a power amplifier circuit connected between the power terminal and the ground terminal, a negative potential detection circuit connected to the output terminal, a bias start-up circuit that is controlled by an input of the control terminal, an output of the negative potential detection circuit, and the potential of the ripple terminal, and controls a bias start-up signal, a power amplifier IC that has a bias circuit which is controlled to be started up by the bias start-up signal, and has its output node for outputting a power amplifier bias voltage connected to the ripple terminal, and a ripple filter capacitor externally connected to the ripple terminal of the power amplifier IC.

20 Claims, 4 Drawing Sheets

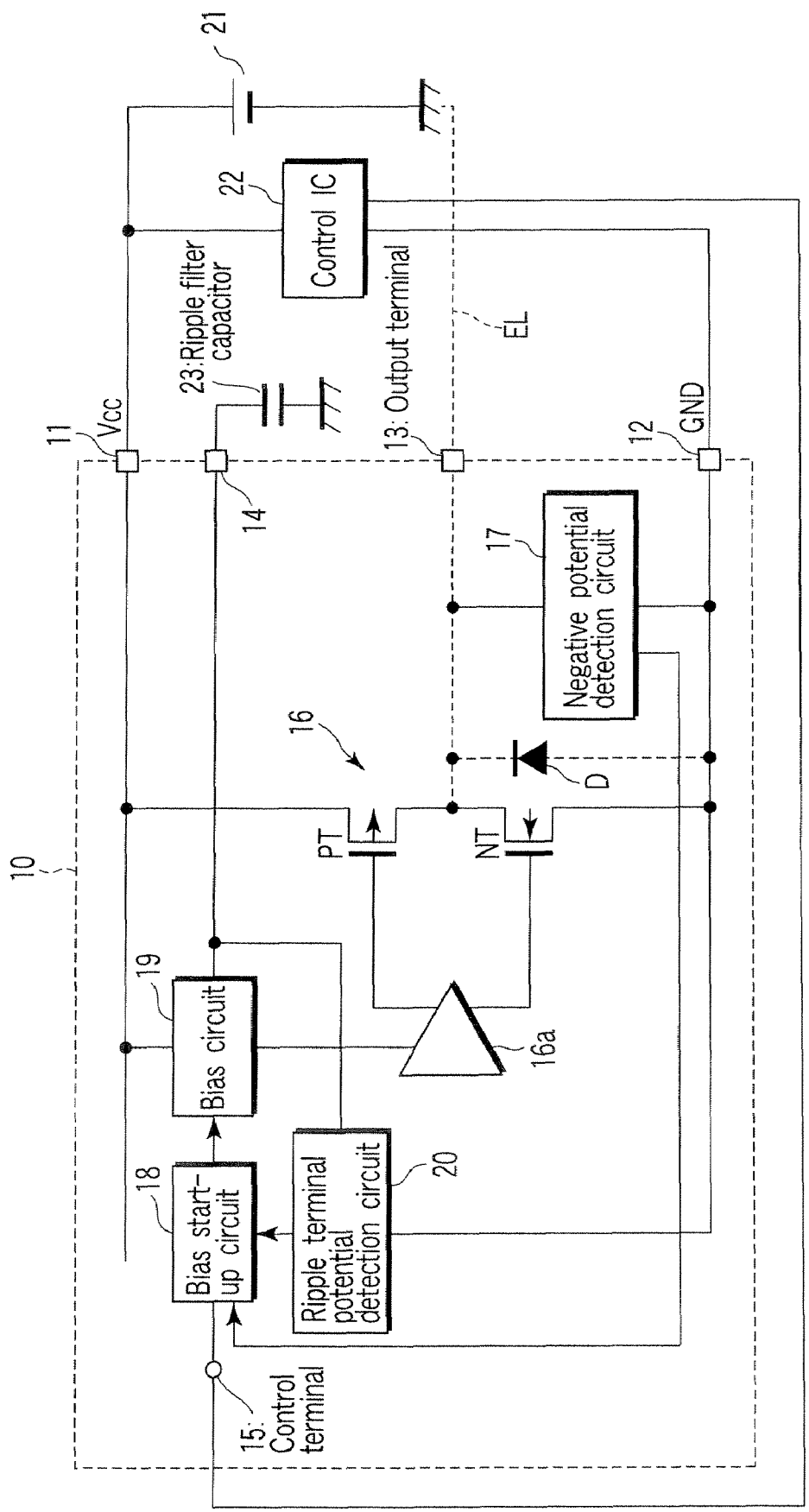
F I G. 1

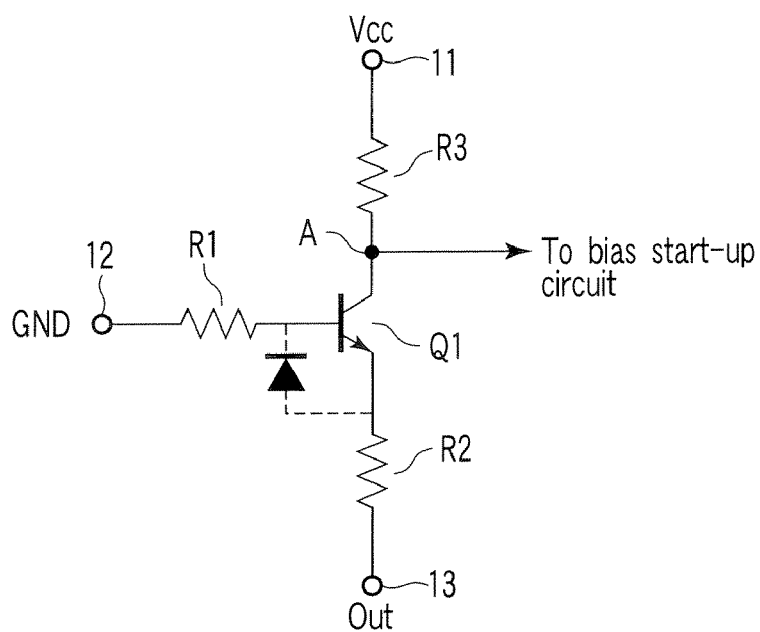
F I G. 2
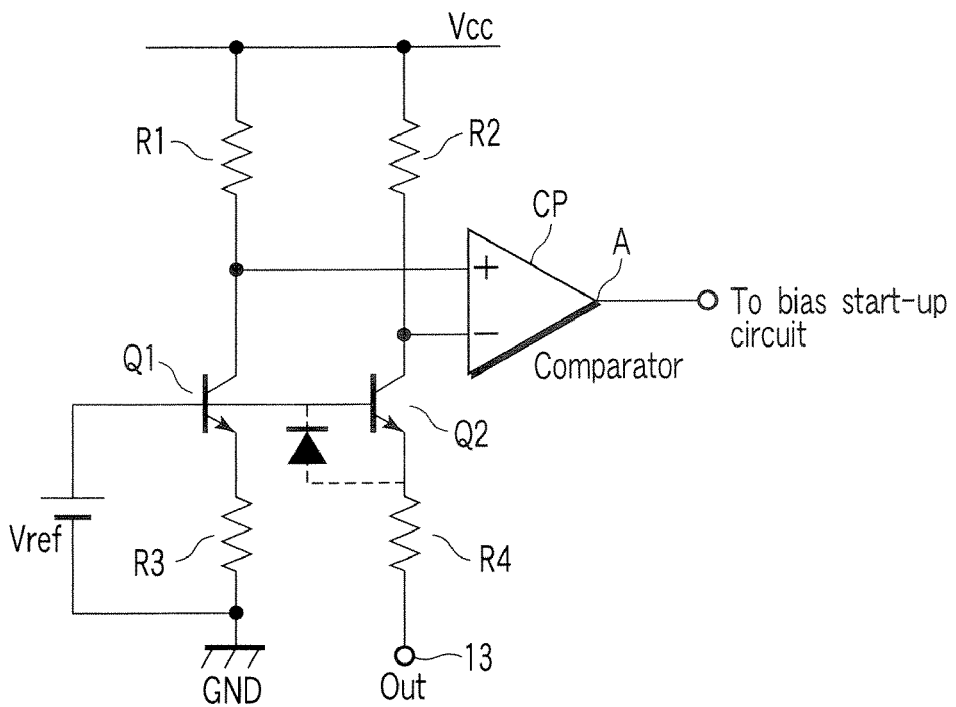
F I G. 3

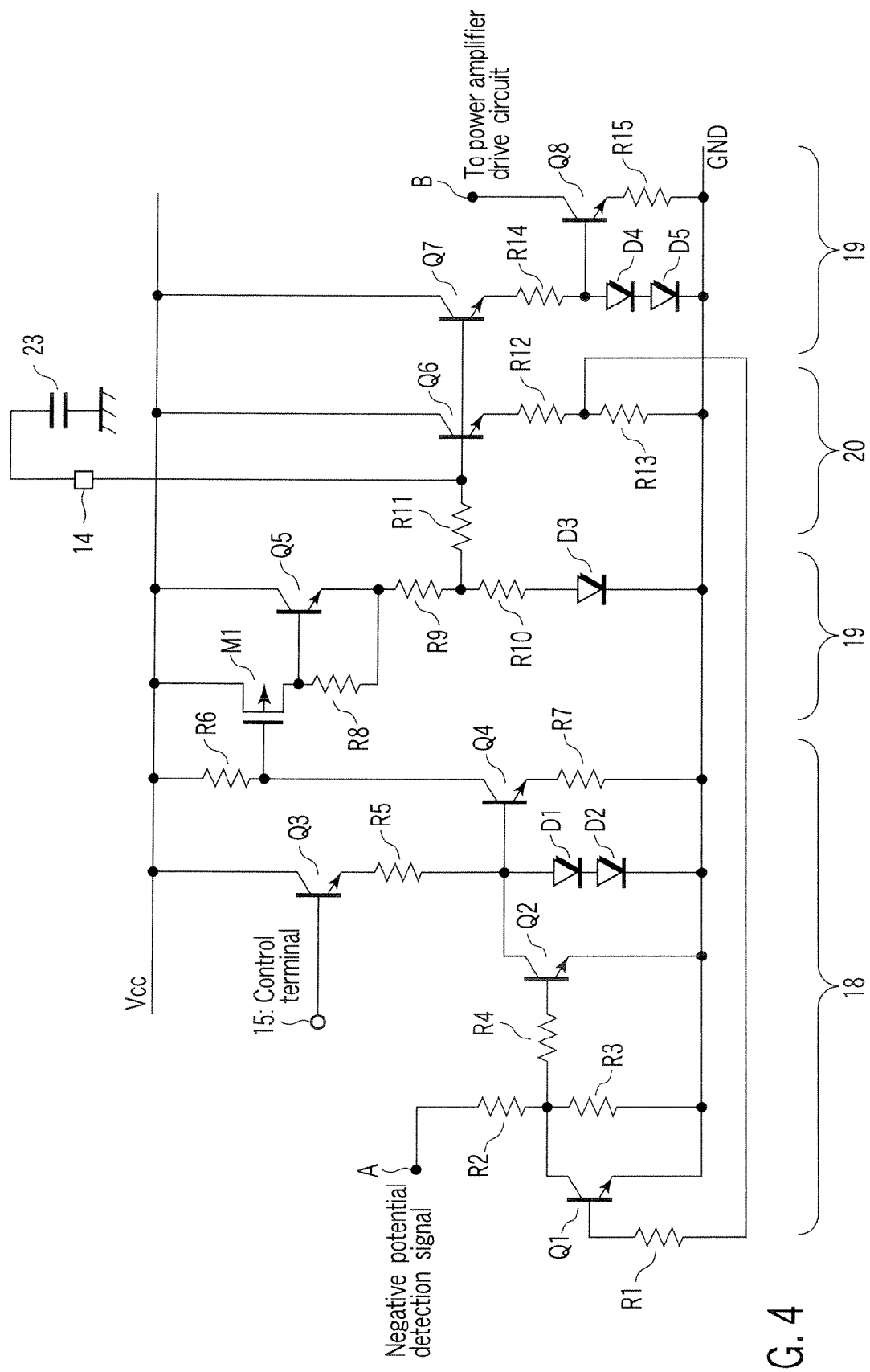
F I G. 4

POWER AMPLIFIER SYSTEM PROVIDED WITH IMPROVED PROTECTION FUNCTION

CROSS-REFERENCE TO RELATED APPLICATIONS

This application is based upon and claims the benefit of priority from prior Japanese Patent Application No. 2005-275997, filed Sep. 22, 2005, the entire contents of which are incorporated herein by reference.

BACKGROUND OF THE INVENTION

1. Field of the Invention

The present invention relates to a power amplifier system for use in, for example, a car audio set, and more particularly, to a power amplifier system provided with a protection function in case the GND terminal is open and the output terminal is grounding (referred to as "GND open and output grounding", hereinafter).

2. Description of the Related Art

FIG. 5 shows a block diagram of a power amplifier system that is installed in a car audio set. As shown in FIG. 5, a power amplifier IC 50 includes, as terminals for external connection, a power terminal (Vcc terminal) 11, a ground terminal (GND terminal) 12, an output terminal 13, a ripple terminal 14, etc. Between the power terminal 11 and the ground terminal 12 of the power amplifier IC 50, an external direct-current power supply (battery) 21 is connected, and also a control IC 22 having an external power IC, a microcomputer, etc. for starting up the power amplifier IC 50 is connected (FIG. 5 shows the state in which the battery is incorrectly connected, as will be explained later). Furthermore, a ripple filter capacitor 23, or a capacitor 23 for a ripple filter, for smoothing a bias voltage is connected between the ripple terminal 14 of the power amplifier IC 50 and the ground, and a loudspeaker, not shown, is connected to the output terminal 13. A control signal output from the control IC 22 is supplied to a bias circuit 19.

In the power amplifier IC 50, a push-pull type power amplifier circuit 16 is connected between the power terminal 11 and the ground terminal 12. This push-pull type power amplifier circuit 16 is composed of a PMOS type push side output transistor PT and an NMOS type pull side output transistor NT, which are serially connected. The connection node of these transistors, that is, the push-pull output node of the power amplifier circuit 16 is connected to the output terminal 13. In FIG. 5, "D" is a parasitic diode located between the drain and source of the output transistor NT connected to the ground potential side. Furthermore, these output transistors PT, NT have their gates connected to a driver circuit 16a.

A negative potential detection circuit 17 detects that the output potential of the power amplifier circuit 16 becomes negative, and the negative potential detection output node thereof is connected to a gate impedance control circuit 52.

The bias circuit 19 is controlled to be started up by a control signal output from the control IC 22. The bias circuit 19 supplies a bias voltage to the driver circuit 16a so as to make the power amplifier circuit 16 perform operation, and the bias voltage output node thereof is connected to the driver circuit 16a as well as to the ripple terminal 14.

The gate impedance control circuit 52 is connected between the gate and source of the push side output transistor PT connected to the power supply side, and is controlled by the negative potential detection circuit 17.

When the user installs thus configured power amplifier system in a car audio set, there may be often raised errors in connecting or wiring the power amplifier IC 50 and the battery 21. For example, as shown in FIG. 5, in case the ground terminal of the battery 21 is incorrectly connected to the output terminal 13 of the power amplifier IC 50, the ground terminal 12 of the power amplifier IC 50 is not connected to the ground terminal of the battery 21 to come into open state (GND open and output grounding state). In this case, also the ground terminal of the control IC 22 is not connected to the ground terminal of the battery 21.

In this incorrectly connected state, superficially, it is considered that the control IC 22 and the power amplifier IC 50 are not started up since the ground terminal 12 thereof are open. However, as shown in FIG. 5, since an operating current flows through the ground terminal 12, parasitic diode D, and output terminal 13 of the power amplifier IC 50, undesirably, the control IC 22 is started up correctly. That is, the control IC 22 sends a control signal to start up the power amplifier IC 50 without detecting the incorrect connection. Accordingly, regardless of the incorrect connection, the bias circuit 19 of the power amplifier IC 50 is undesirably started up.

At the same time, the negative potential detection circuit 17 detects that the potential of the output terminal 13 of the power amplifier IC 50 becomes negative, and the gate impedance control circuit 52 operates due to the detection output. At this time, as described above, since the bias circuit 19 is operating, it is determined whether or not the push side output transistor PT can be protected depending on the operation state of the gate impedance control circuit 52.

For example, in case the sensitivity of the gate impedance control circuit 52 is set higher and the gate impedance is suppressed to the minimum, the push side output transistor PT can be protected without breakdown. However, in case the sensitivity of the gate impedance control circuit 52 is set higher, when the power amplifier IC 50 is correctly connected to the power supply to drive loudspeakers, not shown, there may be raised a case in which the negative potential detection circuit 17 is made to malfunction due to the back electromotive force of the loudspeakers. In this case, the push side output transistor PT is made to cut off, and the sound quality is made deteriorate.

In contradiction to the above, in case the sensitivity of the gate impedance control circuit 52 is set lower and the gate impedance is made larger, the bias circuit 19 is started up under the incorrect connection state. Thus, when the gate impedance control circuit 52 is operated by the negative potential detection circuit 17, the push side output transistor PT cannot be protected sufficiently.

Accordingly, in the circuit shown in FIG. 5, so as to secure the sound quality when the power amplifier IC 50 is correctly connected as well as the protection intensity of the push side output transistor PT at the time of the GND open and when the output terminal is grounding, it is necessary to set up the gate impedance control circuit 52 and the negative potential detection circuit 17 carefully. However, since elements in a chip are subject to fluctuation depending on the manufacturing process, the design margin is extremely restricted with respect to the design of respective circuits.

For this reason, there is desired a power amplifier system that can surely prevent the breakdown of a push side output transistor without deteriorating the sound quality of an output signal of a power amplifier IC even if a microcomputer etc. for controlling the power amplifier system sends a control signal for start-up operation to the power amplifier IC when the power amplifier IC is incorrectly connected to come into the GND open and output grounding state.

In the Jpn. Pat. Appln. Laid-Open Publication No. 2004-112019, there is disclosed "grounding protection apparatus for sound power amplification apparatus". In this apparatus, a voltage detection unit detects an applied power supply voltage from a power supply unit to be applied to a sound power amplification circuit unit, and a voltage between unit ground terminals. A control unit generates a switch drive signal to turn on a switch circuit when being judged to be appropriate, and turn off the switch circuit when the sound power amplification circuit unit is judged to be grounding, on the basis of the detection result of the voltage detection unit.

In the Jpn. Pat. Appln. Laid-Open Publication No. 2001-7659, there is disclosed "power amplifier". This power amplifier is formed by a power transistor circuit of the push-pull configuration whose last stage is supplied with a direct current bias. This power amplifier has built therein a grounding breakdown prevention circuit for preventing the flow of an overcurrent by cutting off the direct current bias of a power transistor when the loudspeaker drive output end comes into grounding.

BRIEF SUMMARY OF THE INVENTION

According to a first aspect of the invention, there is provided a power amplifier system comprising: a power terminal; a ground terminal; an output terminal; a ripple terminal; a control terminal to which a control signal for start-up is supplied from outside; first and second MOS transistors that configure a power amplifier circuit connected between the power terminal and the ground terminal, the first and second MOS transistors configuring a push-pull circuit, the first and second MOS transistors having the connection node thereof connected to the output terminal; a negative potential detection circuit being connected to the output terminal, which detects the potential of the output terminal becomes negative; a bias circuit which supplies a bias voltage to the power amplifier circuit, the bias circuit having its output node for outputting the bias voltage connected to the ripple terminal; a bias start-up circuit to which the control signal supplied to the control terminal, a detection signal supplied from the negative potential detection circuit, and the potential of the ripple terminal are supplied, the bias start-up circuit controlling the start-up operation of the bias circuit in accordance with the control signal, the detection signal, and the potential of the ripple terminal; and a ripple filter capacitor connected to the ripple terminal.

According to a second aspect of the invention, there is provided a semiconductor integrated circuit comprising: a power terminal; a ground terminal; an output terminal; a ripple terminal to which a ripple filter capacitor is connected; a control terminal to which a control signal for start-up is supplied from outside; first and second MOS transistors that configure a power amplifier circuit connected between the power terminal and the ground terminal, the first and second MOS transistors configuring a push-pull circuit, the first and second MOS transistors having the connection node thereof connected to the output terminal; a negative potential detection circuit being connected to the output terminal, which detects the potential of the output terminal becomes negative; a bias circuit which supplies a bias voltage to the power amplifier circuit, the bias circuit having its output node for outputting the bias voltage connected to the ripple terminal; and a bias start-up circuit to which the control signal supplied to the control terminal, a detection signal supplied from the negative potential detection circuit, and the potential of the ripple terminal are supplied, the bias start-up circuit controlling the start-up operation of the bias circuit in accordance with the control signal, the detection signal, and the potential of the ripple terminal.

BRIEF DESCRIPTION OF THE SEVERAL VIEWS OF THE DRAWING

FIG. 1 shows a block diagram of the first embodiment of a power amplifier system according to the present invention;

FIG. 2 shows a circuit diagram of the first specific example of the negative potential detection circuit shown in FIG. 1;

FIG. 3 shows a circuit diagram of the second specific example of the negative potential detection circuit shown in FIG. 1;

FIG. 4 shows a circuit diagram of a specific example of the bias start-up circuit, bias circuit, and ripple terminal potential detection circuit shown in FIG. 1.

DETAILED DESCRIPTION OF THE INVENTION

Figure 5:
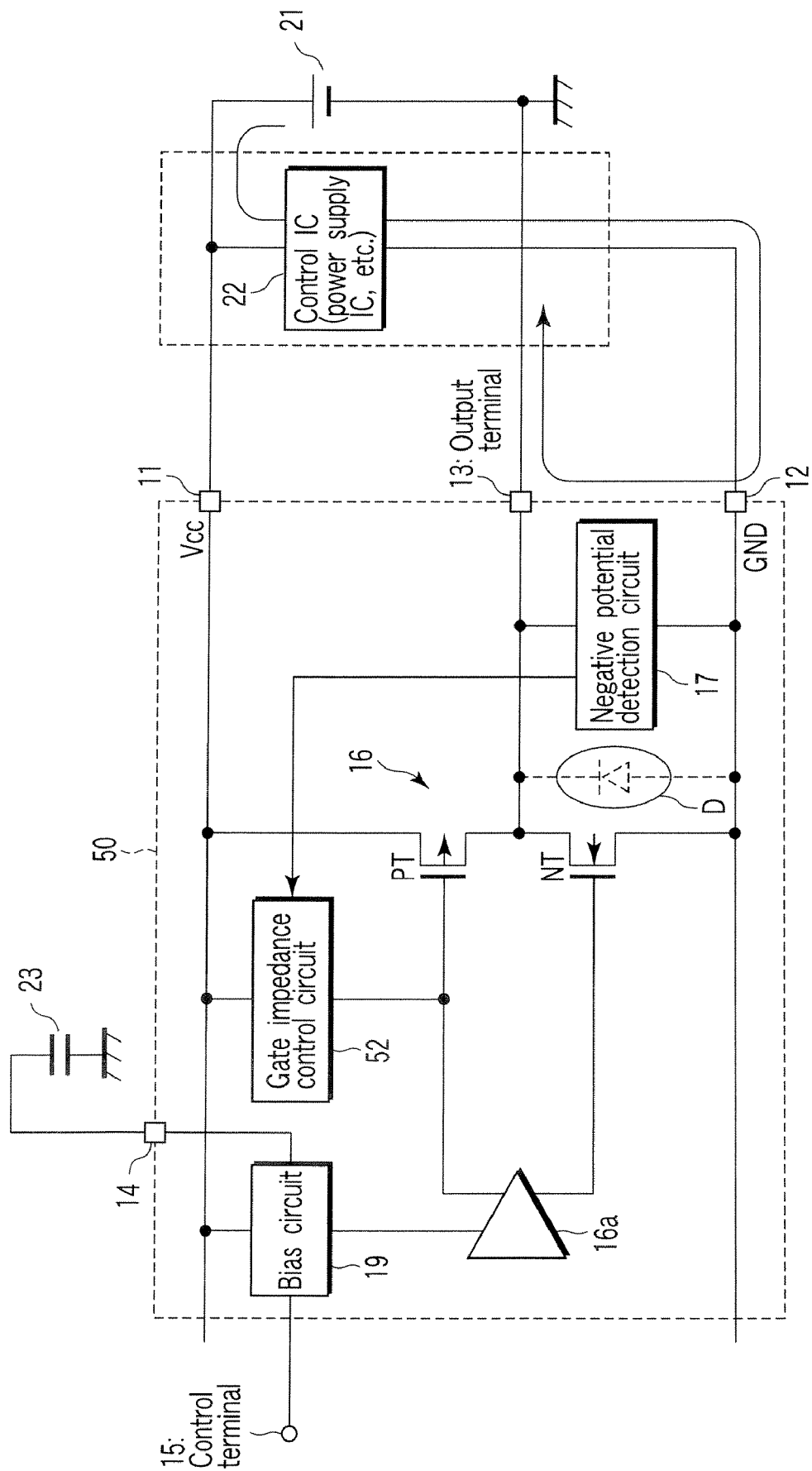
FIG. 5 shows a block diagram of a power amplifier system that is installed in a car audio set.

The embodiments according to the present invention will further be described below with reference to the accompanying drawings. In the plural drawings, similar parts or components are indicated with the same reference numerals.

First Embodiment

FIG. 1 shows a block diagram of the first embodiment of a power amplifier system according to the present invention. As shown in FIG. 1, a power amplifier IC 10 includes, as terminals for external connection, a power terminal (Vcc terminal) 11, a ground terminal (GND terminal) 12, an output terminal 13, a ripple terminal 14, a control terminal 15, etc. Between the power terminal 11 and the ground terminal 12 of the power amplifier IC 10, an external direct-current power supply (battery) 21 is connected, and also a control IC 22 having an external power IC, a microcomputer, etc. is connected. Furthermore, a ripple filter capacitor 23 for smoothing a bias voltage is connected between the ripple terminal 14 of the power amplifier IC 10 and the ground, and a loudspeaker, not shown, are connected to the output terminal 13. A control signal output from the external control IC 22, which operates using the battery 21 as the operation power supply, is supplied to the control terminal 15 of the power amplifier IC 10.

In the power amplifier IC 10, a PMOS type push side output transistor PT and an NMOS type pull side output transistor NT are serially connected between the power terminal 11 and the ground terminal 12. The transistors PT, NT configure a push-pull type power amplifier circuit 16. An output node of the power amplifier circuit 16, that is, the connection node of these output transistors PT, NT is connected to the output terminal 13. These push side output transistor PT and pull side output transistor NT have their gates connected to a driver circuit 16a. In FIG. 1, "D" is a parasitic diode located between the drain and source of the pull side output transistor NT connected to the ground potential side.

A negative potential detection circuit 17 detects that the output potential of the power amplifier circuit 16 becomes negative, and the negative potential detection output node thereof is connected to a bias start-up circuit 18.

The bias start-up circuit 18 is controlled by a control signal supplied from the control terminal 15, an output signal (negative potential detection signal) supplied from the negative potential detection circuit 17, and the potential of the ripple terminal 14 to be described later, and supplies a bias start-up signal to a bias circuit 19 to be described later. The bias start-up circuit 18 is configured so that generation of the bias start-up signal is controlled in accordance with the logical level (active level/inactive level) of the control signal, negative potential detection signal, and ripple potential detection signal, and the combination of the change order thereof.

The bias voltage output node of the bias circuit 19 is connected to the driver circuit 16a as well as to the ripple terminal 14. The bias circuit 19 is started up by the bias start-up signal output from the bias start-up circuit 18, and supplies a bias voltage to the driver circuit 16a. Accordingly, the power amplifier circuit 16 is made to perform operation.

A ripple terminal potential detection circuit 20 detects the potential of the ripple terminal 14. On the other hand, in case the potential of the ripple terminal 14 is directly utilized, the ripple terminal potential detection circuit 20 can be omitted.

When the user installs thus configured power amplifier system in, for example, a car audio set, there may be often raised errors in connecting or wiring the power amplifier IC 10 and the battery 21. For example, as shown by a dotted line EL in FIG. 1, in case the ground terminal of the battery 21 is incorrectly connected to the output terminal 13 of the power amplifier IC 10, the ground terminal 12 of the power amplifier IC 10 is not connected to the ground terminal of the battery 21 to come into open state (GND open and output grounding state). In this case, also the ground terminal of the control IC 22, etc. is not connected to the ground terminal of the battery 21.

In case of this incorrectly connected state, superficially, it is considered that the control IC 22 and the power amplifier IC 10 are not started up since the ground terminal thereof are open. However, since an operating current flows through the ground terminal 12, parasitic diode D, and output terminal 13 of the power amplifier IC 10, undesirably, the control IC 22 is started up correctly. That is, the control IC 22 supplies a control signal of active level to start up the power amplifier IC 10 to the control terminal 15 of the power amplifier IC 10 without detecting the incorrect connection. Accordingly, the control signal is supplied to the bias start-up circuit 18 through the control terminal 15. At the same time, the negative potential detection circuit 17 detects that the potential of the output terminal 13 of the power amplifier IC 10 becomes negative, and supplies a negative potential detection signal of active level to the bias start-up circuit 18.

In this way, also when a control signal of active level as well as a negative potential detection signal of active level are sent to the bias start-up circuit 18, in case the potential of the ripple terminal 14 is of inactive level, the bias start-up circuit 18 determines that the input of the negative potential detection signal is invalid to set the bias start-up signal off. Accordingly, the bias circuit 19 is not started up. As a result, the power amplifier IC 10 is not supplied with a bias voltage, and stays in off state. In this case, in the push side output transistor PT, the voltage between the drain and source is set approximately to the voltage of the battery 21, which does not start up the bias circuit 19. Therefore, it becomes possible to surely prevent the breakdown of the push side output transistor PT.

On the other hand, in case the power amplifier IC 10 is correctly connected to the power supply, a control signal of active level is supplied to the bias start-up circuit 18. Accordingly, the bias start-up signal is set on, starting up the bias circuit 19. Furthermore, in case the potential of the ripple terminal 14 rises to or more than a predetermined value, the potential of the ripple terminal 14 is applied to the bias start-up circuit 18 through the ripple terminal potential detection circuit 20 as a signal of active level. Then, in the state in which the loudspeaker is driven, in case the negative potential detection circuit 17 is made to malfunction due to the back electromotive force of the loudspeaker and a negative potential detection signal of active level is sent to the bias start-up circuit 18, the bias start-up circuit 18 does not set the bias start-up signal off. Accordingly, the push side output transistor PT is not cut off, and the sound quality can be prevented from being deteriorated.

On the other hand, in case a control signal output from the control IC 22 is of inactive level, the bias start-up circuit 18 of the power amplifier IC 10 is off, and the bias start-up signal is off.

Table 1 shows above-described operations.

TABLE 1

| Control signal | Negative potential detection signal | Potential of ripple terminal | Bias start-up signal |
|---|---|---|---|
| Active level | Active level | Inactive level | Off |
| Active level | Active level | Active level | On |
| Active level | Inactive level | Active level | On |
| Inactive level | Active level | Inactive level | Off |
| Inactive level | Inactive level | Inactive level | Off |

(First Example of Negative Potential Detection Circuit)

FIG. 2 shows a circuit diagram of the first example of the negative potential detection circuit 17 shown in FIG. 1. The negative potential detection circuit 17 includes an NPN type detection transistor 15 Q1, a resistor R1 connected between the base of the transistor Q1 and the ground terminal (GND terminal) 12 of the power amplifier IC 10, a resistor R2 connected between the emitter of the transistor Q1 and the output terminal (Out terminal) 13 of the power amplifier IC 20 10, and a resistor R3 connected between the collector of the transistor Q1 and the power terminal 11 of the power amplifier IC 10. The collector of the transistor Q1 is a detection output node A.

In case the power amplifier IC 10 is correctly connected to the power supply, the potential of the output terminal 13 is higher than that of the GND, and a current does not flow through the base of the detection transistor Q1. Accordingly, the detection output node A becomes "H" level, indicating non-detection state.

On the other hand, in case the power amplifier IC 10 is incorrectly connected to the power supply, the potential of the output terminal 13 becomes lower than that of the GND. In this case, when a forward direction voltage VBE occurs between the base and emitter of the detection transistor Q1, a current flows through the base of the detection transistor Q1. Accordingly, the detection transistor Q1 is turned on, and the detection output node A becomes "L" level, indicating detection state.

The resistors R1, R2 can have their values arbitrarily set up. The resistors R1, R2 are arranged so as to improve the breakdown voltage for a surge input etc. in case a current path between the ground terminal 12 and the output terminal 13 is formed at the time of the incorrect connection state. One of the resistors R1, R2 may be removed. Furthermore, in case the emitter back withstand voltage of the detection transistor Q1 is low, as shown by a dotted line in FIG. 2, a PN junction element, whose direction is opposite to that of the base-emitter junction (diode), may be connected in parallel between the base and emitter of the detection transistor Q1.

(Second Example of Negative Potential Detection Circuit)

FIG. 3 shows a circuit diagram of the second example of the negative potential detection circuit 17 shown in FIG. 1. In the negative potential detection circuit 17, the base of an NPN type transistor Q1 for detecting ground potential is connected to a reference potential Vref, a resistor R1 is connected between the collector of the transistor Q1 and the power supply node, and a resistor R3 is connected between the emitter of the transistor Q1 and the ground potential GND.

The base of an NPN type transistor Q2 for detecting an output potential is connected to the reference potential Vref, a resistor R2 is connected between the collector of the transistor Q2 and the power supply node, and a resistor R4 is connected between the emitter of the transistor Q2 and the output terminal 13 of the power amplifier IC 10.

The collector of the ground potential detection transistor Q1 and the collector of the output potential detection transistor Q2 are connected to two input nodes of a voltage comparator CP. The output node of the voltage comparator CP is a detection output node A, which is connected to the bias start-up circuit 18 shown in FIG. 1.

In case the power amplifier IC 10 is correctly connected to the power supply, the potential of the output terminal 13 is equal to or higher than the ground potential. In this case, by setting up the resistance ratio of the resistors R1, R2, R3, R4 so that the voltage drop of the resistor R2 is smaller than the voltage drop of the resistor R1, the output node A of the comparator CP becomes "L" level (non-detection state).

On the other hand, in case the power amplifier IC 10 is incorrectly connected to the power supply, the potential of the output terminal 13 of the power amplifier IC 10 becomes lower than the ground potential. In this case, by setting up the resistance ratio of the resistors R1, R2, R3, R4 so that the voltage drop of the resistor R2 is larger than the voltage drop of the resistor R1, the output node A of the comparator CP becomes "H" level (detection state).

The resistor R4 has to have its value arbitrarily set up so as to improve the breakdown voltage for a surge input, etc., of the output terminal 13. Furthermore, in case the emitter back withstand voltage of the detection transistor Q2 is low, as shown by a dotted line in FIG. 3, a PN junction element, whose direction is opposite to that of the base-emitter junction, may be connected in parallel between the base and emitter of the detection transistor Q2.

(Example of Bias Start-Up Circuit)

FIG. 4 shows a circuit diagram of an example of the bias start-up circuit 18, bias circuit 19, and ripple terminal potential detection circuit 20 shown in FIG. 1. In the bias start-up circuit 18, a negative potential detection node A to which a negative potential detection signal is supplied is connected to the ground potential GND through serially connected resistors R2, R3. The connection node of the resistors R2, R3 is connected to the base of an NPN type transistor Q2 through a resistor R4. The transistor Q2 has its emitter connected to the ground potential, and has its collector connected to the ground potential through a diode stack circuit in which diodes D1, D2 are serially connected. Furthermore, the transistor Q2 has its collector connected to the emitter of an NPN type transistor Q3 through a resistor R5. The transistor Q3 has its collector connected to the power (Vcc) node, and has its base connected to the control terminal 15. Furthermore, the transistor Q2 has its collector connected to the base of an NPN type transistor Q4. This transistor Q4 has its emitter connected to the ground potential through a resistor R7, and has its collector connected to the power node through a resistor R6.

In the bias circuit 19, a PMOS type transistor M1 has its gate connected to the collector of the transistor Q4 of the bias start-up circuit 18, and has its source connected to the power node. The transistor M1 has its drain connected to the base of an NPN type transistor Q5 as well as to the emitter of the transistor Q5 through a resistor R8. This transistor Q5 has its collector connected to the power node, and has its emitter connected to the ground potential through serially connected resistors R9, R10, and diode D3.

The connection node of the resistors R9, R10 is connected to the ripple terminal 14 through a resistor R11 of the ripple terminal potential detection circuit 20. The capacitor 23 connected to the resistor R11 and to the ripple terminal 14 configures a ripple filter. In the ripple terminal potential detection circuit 20, an NPN type transistor Q6 has its base connected to the ripple terminal 14, and has its collector connected to the power node, has its emitter connected to the ground potential through serially connected resistors R12, R13. The connection node of the resistors R12, R13 is connected to the base of the NPN type transistor Q1 through the resistor R1 of the bias start-up circuit 18. The transistor Q1 has its emitter connected to the ground potential, and has its collector connected to the connection node of the resistors R2, R3.

In the bias circuit 19, an NPN type transistor Q7 has its collector connected to the power node, and has its base connected to the base of the transistor Q6. Furthermore, the transistor Q7 has its emitter connected to the ground potential through a serially connected resistor R14 and diodes D4, D5. The diodes D4 and D5 constitute a diode stack circuit. The connection node of the resistor R14 and the diode D4 is connected to the base of an NPN type transistor Q8. This transistor Q8 has its emitter connected to the ground potential through a resistor R15, and has its collector being a power amplifier bias node B connected to the power amplifier driver circuit 16a.

(Initial State)

The operation of the circuit shown in FIG. 4 which has above-described configuration will be explained In the initial state, the control terminal 15 is of inactive level ("L" level), and the transistors Q3, Q4 are in off state, and also the transistors M1, Q5 are in off state. Thus, the ripple filter capacitor 23 is not charged. Accordingly, also the transistors Q6, Q7 are in off state, and a power amplifier bias current does not flow through the transistor Q8.

(At the Time of Start-Up)

Next, the operation when the active level ("H" level) is applied to the control terminal 15 from a microcomputer, etc., will be explained. At the moment when the control terminal 15 becomes "H" level, the ripple filter capacitor 23 is not charged.

Accordingly, the transistor Q6 stays in off state, and values of the resistors R12, R13 are previously set up so that also the transistor Q1 stays in off state in this state.

When the control terminal 15 becomes active level ("H"), the transistor Q3 comes into on state. At this time, in case a negative potential detection signal is of active level ("H"), the transistor Q2 comes into on state, and it is possible to set the transistor Q4 in off state even if the transistor Q3 is in on state. Owing to the start-up prevention operation, even if the control terminal 15 becomes "H" level in the GND open and output grounding state, there is raised no possibility that a bias current of a power amplifier flows through the transistor Q8. Accordingly, the power amplifier circuit 16 can be surely protected.

(Prevention of Malfunction in Correct Operation State)

When the power amplifier IC 10 is correctly connected to the power supply, in case the control terminal 15 is of active level ("H"), and a negative potential detection signal is of inactive level ("L"), the transistor Q2 is in off state, and the transistors Q3, Q4 are in on state, and also the transistors M1, Q5 are in on state. Therefore, the ripple filter capacitor 23 is charged, and a bias current of a power amplifier flows through the transistor Q8. After the power amplifier transfers to the bias state, the transistors Q6, Q1 are in on state. As a result, even if a negative potential detection signal becomes active level ("H"), there is raised no possibility that the transistor Q2 comes into on state. Accordingly, the operation of the bias circuit 19 is not prevented. Thus, when loudspeaker is driven by an output of the power amplifier circuit 16, even if the negative potential detection circuit 17 is made to malfunction due to the back electromotive force of the loudspeaker, the operation of the power amplifier circuit 16 is not cut off. As a result, deterioration of the sound quality can be prevented. Accordingly, the negative potential detection circuit 17 and the bias start-up circuit 18 can be of simple configuration that can be easily designed, securing the sound quality as well as the protection intensity at the time of the GND open and output grounding state of a power amplifier system.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A power amplifier system comprising:
   a power terminal;
   a ground terminal;
   an output terminal;
   a ripple terminal;
   a control terminal to which a control signal for start-up is supplied from outside;
   first and second MOS transistors that configure a power amplifier circuit connected between the power terminal and the ground terminal, the first and second MOS transistors configuring a push-pull circuit, the first and second MOS transistors having the connection node thereof connected to the output terminal;
   a negative potential detection circuit being connected to the output terminal, which detects the potential of the output terminal becomes negative;
   a bias circuit which supplies a bias voltage to the power amplifier circuit, the bias circuit having its output node for outputting the bias voltage connected to the ripple terminal;
   a bias start-up circuit to which the control signal supplied to the control terminal, a detection signal supplied from the negative potential detection circuit, and the potential of the ripple terminal are supplied, the bias start-up circuit controlling the start-up operation of the bias circuit in accordance with the control signal, the detection signal, and the potential of the ripple terminal; and
   a ripple filter capacitor connected to the ripple terminal.

2. The system according to claim 1,
   wherein the first MOS transistor configures a push side output transistor, and the second MOS transistor configures a pull side output transistor, and a parasitic diode is located between the drain and source of the pull side output transistor.

3. The system according to claim 1, wherein the bias start-up circuit comprises:
   a first circuit for outputting a first signal to set the bias circuit in non-start-up state based on the logical level of inactive state of the control terminal in the initial state, for outputting a first signal to set the bias circuit in non-start-up state even if the logical level of the control terminal becomes active at the time of GND open and output grounding state in which the ground terminal is open when the ground potential is connected to the output terminal, and for outputting a first signal to set the bias circuit in non-start-up state even if the logical level of the detection signal supplied from the negative potential detection circuit becomes active; and
   a second circuit for making the bias circuit transfer to start-up state in case the logical level of the detection signal supplied from the negative potential detection circuit is inactive when the power amplifier circuit is in normal operation state, and for keeping the bias circuit in start-up state even if the logical level of the detection signal becomes active.

4. The system according to claim 1, further comprising:
   a battery connected to the power terminal;
   loudspeaker connected to the output terminal; and
   a control integrated circuit for supplying the control signal to the control terminal, the control integrated circuit using the battery as a power supply for operation.

5. The system according to claim 1, further comprising:
   a ripple terminal potential detection circuit for detecting the potential of the ripple terminal, the ripple terminal potential detection circuit being connected to the ripple terminal, a detection signal of the ripple terminal potential detection circuit being supplied to the bias start-up circuit.

6. The system according to claim 1, wherein the negative potential detection circuit comprises:
   a first NPN transistor that has its collector connected to the power terminal, and has its emitter connected to the output terminal, and has its base connected to the ground terminal, the first NPN transistor having its collector connected to the bias start-up circuit.

7. The system according to claim 1, wherein the negative potential detection circuit comprises:

a second NPN transistor that has its collector connected to the power terminal, and has its emitter connected to the output terminal, and has its base connected to a reference power supply;

a third NPN transistor that has its collector connected to the power terminal, and has its emitter connected to the ground terminal, and has its base connected to the reference power supply; and a voltage comparator that has its first and second input terminals connected to the collectors of the second and third NPN transistors, and has its output terminal connected to the bias start-up circuit.

8. The system according to claim 1, wherein the bias start-up circuit comprises:

a fourth NPN transistor whose base is supplied with the potential of the ripple terminal, and has its emitter connected to the ground terminal;

a fifth NPN transistor that has its base connected to the collector of the fourth NPN transistor, which is supplied with a detection signal of the negative potential detection circuit, and has its emitter connected to the ground terminal;

a sixth NPN transistor whose base is supplied with the control signal, and has its collector connected to the power terminal, and has its emitter connected to the collector of the fifth NPN transistor; and a seventh NPN transistor that has its base connected to the collector of the fifth NPN transistor, and has its collector connected to the power terminal, and has its emitter connected to the ground terminal.

9. The system according to claim 8, wherein the bias circuit comprises:

a MOS transistor that has its gate connected to the collector of the seventh NPN transistor, and has its one end of the current path connected to the power terminal;

an eighth NPN transistor that has its base connected to the other end of the current path of the MOS transistor, and has its collector connected to the power terminal; and a first and a second resistors which are serially connected between the eighth NPN transistor and the ground terminal, the first and second resistors outputting the bias voltage from the connection node thereof.

10. The system according to claim 9, wherein the ripple terminal potential detection circuit comprises:

a ninth NPN transistor that has its base connected to the ripple terminal, and has its collector connected to the power terminal; and a third and a fourth resistors which are connected between the emitter of the ninth NPN transistor and the ground terminal, the third and fourth resistors outputting the potential of the ripple terminal from the connection node thereof.

11. A semiconductor integrated circuit comprising:
a power terminal;
a ground terminal;
an output terminal;
a ripple terminal to which a ripple filter capacitor is connected;
a control terminal to which a control signal for start-up is supplied from outside;
first and second MOS transistors that configure a power amplifier circuit connected between the power terminal and the ground terminal, the first and second MOS transistors configuring a push-pull circuit, the first and second MOS transistors having the connection node thereof connected to the output terminal;

a negative potential detection circuit being connected to the output terminal, which detects the potential of the output terminal becomes negative;

a bias circuit which supplies a bias voltage to the power amplifier circuit, the bias circuit having its output node for outputting the bias voltage connected to the ripple terminal; and a bias start-up circuit to which the control signal supplied to the control terminal, a detection signal supplied from the negative potential detection circuit, and the potential of the ripple terminal are supplied, the bias start-up circuit controlling the start-up operation of the bias circuit in accordance with the control signal, the detection signal, and the potential of the ripple terminal.

12. The circuit according to claim 11,
wherein the first MOS transistor configures a push side output transistor, and the second MOS transistor configures a pull side output transistor, and a parasitic diode is located between the drain and source of the pull side output transistor.

13. The circuit according to claim 11, wherein the bias start-up circuit comprises:

a first circuit for outputting a first signal to set the bias circuit in non-start-up state based on the logical level of inactive state of the control terminal in the initial state, for outputting a first signal to set the bias circuit in non-start-up state even if the logical level of the control terminal becomes active at the time of GND open and output grounding state in which the ground terminal is open when the ground potential is connected to the output terminal, and for outputting a first signal to set the bias circuit in non-start-up state even if the logical level of the detection signal supplied from the negative potential detection circuit becomes active; and a second circuit for making the bias circuit transfer to start-up state in case the logical level of the detection signal supplied from the negative potential detection circuit is inactive when the power amplifier circuit is in normal operation state, and for keeping the bias circuit in start-up state even if the logical level of the detection signal becomes active.

14. The circuit according to claim 11, further comprising:
a battery connected to the power terminal;
loudspeaker connected to the output terminal; and
a control integrated circuit for supplying the control signal to the control terminal, the control integrated circuit using the battery as a power supply for operation.

15. The circuit according to claim 11, further comprising:
a ripple terminal potential detection circuit for detecting the potential of the ripple terminal, the ripple terminal potential detection circuit being connected to the ripple terminal, a detection signal of the ripple terminal potential detection circuit being supplied to the bias start-up circuit.

16. The circuit according to claim 11, wherein the negative potential detection circuit comprises:

a first NPN transistor that has its collector connected to the power terminal, and has its emitter connected to the output terminal, and has its base connected to the ground terminal, the first NPN transistor having its collector connected to the bias start-up circuit.

17. The circuit according to claim 11, wherein the negative potential detection circuit comprises:

a second NPN transistor that has its collector connected to the power terminal, and has its emitter connected to the output terminal, and has its base connected to a reference power supply;

a third NPN transistor that has its collector connected to the power terminal, and has its emitter connected to the ground terminal, and has its base connected to the reference power supply; and a voltage comparator that has its first and second input terminals connected to the collectors of the second and third NPN transistors, and has its output terminal connected to the bias start-up circuit.

18. The circuit according to claim 11, wherein the bias start-up circuit comprises:

a fourth NPN transistor whose base is supplied with the potential of the ripple terminal, and has its emitter connected to the ground terminal;

a fifth NPN transistor that has its base connected to the collector of the fourth NPN transistor, which is supplied with a detection signal of the negative potential detection circuit, and has its emitter connected to the ground terminal;

a sixth NPN transistor whose base is supplied with the control signal, and has its collector connected to the power terminal, and has its emitter connected to the collector of the fifth NPN transistor; and a seventh NPN transistor that has its base connected to the collector of the fifth NPN transistor, has its collector connected to the power terminal, and has its emitter connected to the ground terminal.

19. The circuit according to claim 18, wherein the bias circuit comprises:

a MOS transistor that has its gate connected to the collector of the seventh NPN transistor, and has its one end of the current path connected to the power terminal;

an eighth NPN transistor that has its base connected to the other end of the current path of the MOS transistor, and has its collector connected to the power terminal; and a first and a second resistors which are serially connected between the eighth NPN transistor and the ground terminal, the first and second resistors outputting the bias voltage from the connection node thereof.

20. The circuit according to claim 19, wherein the ripple terminal potential detection circuit comprises:

a ninth NPN transistor that has its base connected to the ripple terminal, and has its collector connected to the power terminal; and a third and a fourth resistors which are connected between the emitter of the ninth NPN transistor and the ground terminal, the third and fourth resistors outputting the potential of the ripple terminal from the connection node thereof.

* * * * *